United States Patent
Zhou et al.

(10) Patent No.: US 12,230,202 B2
(45) Date of Patent: Feb. 18, 2025

(54) DISPLAY DRIVING CIRCUIT AND DISPLAY DEVICE

(71) Applicant: HKC CORPORATION LIMITED, Shenzhen (CN)

(72) Inventors: Xiufeng Zhou, Shenzhen (CN); Xin Yuan, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/087,771

(22) Filed: Dec. 22, 2022

(65) Prior Publication Data

US 2023/0419899 A1    Dec. 28, 2023

(30) Foreign Application Priority Data

Jun. 27, 2022   (CN) .......................... 202210745363.2

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01); *G09G 2310/0202* (2013.01); *G09G 2320/0233* (2013.01); *G09G 2330/02* (2013.01)

(58) Field of Classification Search
CPC ......... G09G 3/3233; G09G 2300/0819; G09G 2320/0233
See application file for complete search history.

(56) References Cited

U.S. PATENT DOCUMENTS 7,446,742 B2    11/2008  Noda et al.
12,069,893 B2 *  8/2024  Mou .................... H10K 59/123
(Continued)

FOREIGN PATENT DOCUMENTS

CN    1689063 A    10/2005
CN    100479016 C   4/2009
(Continued)

OTHER PUBLICATIONS

Chinese First Office Action, Chinese Application No. 202210745363.2, mailed Feb. 11, 2023 (16 pages).
(Continued)

*Primary Examiner* — William Boddie
*Assistant Examiner* — Bipin Gyawali

(57) ABSTRACT

The present disclosure provides a display driving circuit and a display device. The display driving circuit includes multiple pixel circuits. A data end of each pixel circuit is connected to a data line, configured to provide a data signal; a gate end of each pixel circuit is connected to a gate line, configured to provide a gate signal; and a power supply end of each pixel circuit is connected to a same power supply common line. The multiple pixel circuits are divided into at least one first pixel circuit and at least one second pixel circuit, and a luminous efficiency of the first pixel circuit is less than that of the second pixel circuit; a width-to-length ratio of a channel of a thin-film field-effect transistor in a driving module of the first pixel circuit is greater than that of the second pixel circuit.

10 Claims, 4 Drawing Sheets

(56) References Cited

U.S. PATENT DOCUMENTS

| | | | |
|---|---|---|---|
| 2003/0052618 A1* | 3/2003 | Ishizuka | H10K 59/1213 |
| | | | 315/161 |
| 2005/0052375 A1* | 3/2005 | Devos | G06F 3/1446 |
| | | | 345/82 |
| 2006/0158396 A1* | 7/2006 | Jo | G09G 3/3283 |
| | | | 345/76 |
| 2006/0221092 A1* | 10/2006 | Noguchi | H05B 33/02 |
| | | | 345/589 |
| 2009/0121984 A1* | 5/2009 | Yamamoto | G09G 3/3696 |
| | | | 345/76 |
| 2012/0113737 A1* | 5/2012 | Lee | G11C 5/147 |
| | | | 327/108 |
| 2015/0035871 A1* | 2/2015 | Kawae | G09G 3/3233 |
| | | | 345/212 |
| 2015/0269887 A1* | 9/2015 | Liu | G09G 3/3208 |
| | | | 345/212 |
| 2015/0356947 A1* | 12/2015 | Eom | G09G 3/3225 |
| | | | 345/211 |
| 2016/0351106 A1* | 12/2016 | Li | G02F 1/13452 |
| 2017/0162092 A1* | 6/2017 | Kim | G09G 3/006 |
| 2019/0259327 A1* | 8/2019 | Li | G09G 3/3233 |
| 2020/0380915 A1 | 12/2020 | Yoon et al. | |
| 2021/0125555 A1 | 4/2021 | Yamamoto | |
| 2021/0193013 A1* | 6/2021 | Xu | H10K 59/353 |
| 2021/0376026 A1* | 12/2021 | Mou | H10K 59/123 |
| 2022/0036808 A1 | 2/2022 | Wu et al. | |
| 2022/0102421 A1* | 3/2022 | Yang | H10K 59/353 |
| 2022/0123073 A1* | 4/2022 | Li | H10K 59/131 |
| 2023/0043626 A1* | 2/2023 | Cong | G09G 3/32 |
| 2023/0377501 A1* | 11/2023 | Yuan | G09G 3/20 |

FOREIGN PATENT DOCUMENTS

| | | |
|---|---|---|
| CN | 103002624 A | 3/2013 |
| CN | 103003864 A | 3/2013 |
| CN | 104078003 A | 10/2014 |
| CN | 107134258 A | 9/2017 |
| CN | 108596083 A | 9/2018 |
| CN | 109712551 A | 5/2019 |
| CN | 110060621 A | 7/2019 |
| CN | 110137236 A | 8/2019 |
| CN | 110751922 A | 2/2020 |
| CN | 210575036 U | 5/2020 |
| CN | 111583865 A | 8/2020 |
| CN | 112542126 A | 3/2021 |
| CN | 12735341 A | 4/2021 |
| CN | 214477461 U | 10/2021 |
| CN | 114299891 A | 4/2022 |
| CN | 115240585 A | 10/2022 |
| EP | 1204089 A1 | 5/2002 |
| JP | 2005070540 A | 3/2005 |
| WO | 2021102972 A1 | 6/2021 |

OTHER PUBLICATIONS

International Search Report, International Application No. PCT/CN2022/140790, mailed Mar. 21, 2023 (19 pages).

Notification to Grant Patent Right for Invention, Chinese Application No. 202210745363.2, mailed Apr. 21, 2023 (6 pages).

* cited by examiner

DISPLAY DRIVING CIRCUIT AND DISPLAY DEVICE

CROSS REFERENCE

The present application claims priority of Chinese Patent Application No. 202210745363.2, filed on Jun. 27, 2022, the entire contents of which are hereby incorporated by reference in its entirety.

TECHNICAL FIELD

The present disclosure relates to the field of display technologies, and in particular to a display driving circuit and a display device.

BACKGROUND

In the related art, multiple pixel circuits are usually required in a display device to form a pixel circuit array corresponding to a display screen. Among the pixel circuits, there are usually pixel circuits with a variety of luminous efficiencies, such as red pixel circuits capable of emitting red light, green pixel circuits, and blue pixel circuits. For the pixel circuits with lower luminous efficiency (e.g., blue pixel circuit) and the pixel circuits with higher luminous efficiency (e.g., red pixel circuit or green pixel circuit), when subjected to the same current, the luminance of light emitted by the pixel circuit with lower luminous efficiency is less than the luminance of light emitted by the pixel circuit with higher luminous efficiency.

Therefore, the drawback of the related art includes that when the multiple pixel circuits share the same voltage provided by the same common line, the currents of the pixel circuits with lower luminous efficiency and the pixel circuits with higher luminous efficiency are the same or similar since the pixel circuits themselves have the same or similar resistance values, which in turn tends to make the luminance of the light emitted by the pixel circuits with lower luminous efficiency in the multiple pixel circuits less than the luminance of the light emitted by the pixel circuits with higher luminous efficiency. This makes the luminance of the light emitted by the pixel circuits with different luminous efficiency in the display device inconsistent, reducing the uniformity of the display screen of the display device and making the display effect of the display device poor.

SUMMARY OF THE DISCLOSURE

The present disclosure provides a display driving circuit and a display device.

A first technical solution proposed by the present disclosure is: a display driving circuit, including a plurality of pixel circuits; wherein a data end of each pixel circuit is connected to a corresponding data line, and the data end is configured to provide a data signal; a gate end of each pixel circuit is connected to a corresponding gate line, and the gate end is configured to provide a gate signal; and a power supply end of each pixel circuit is connected to a same power supply common line; the plurality of pixel circuits are divided into at least one first pixel circuit and at least one second pixel circuit, and a luminous efficiency of each of the at least one first pixel circuit is less than a luminous efficiency of each of the at least one second pixel circuit; a width-to-length ratio of a channel of a thin-film field-effect transistor in a driving module of each of the at least one first pixel circuit is greater than a width-to-length ratio of a channel of a thin-film field-effect transistor in a driving module of each of the at least one second pixel circuit.

A second technical solution proposed by the present disclosure is: a display device, including a light-emitting display module and the display driving circuit as above.

BRIEF DESCRIPTION OF THE DRAWINGS

In order to more clearly illustrate the technical solutions in the embodiments of the present disclosure, the following is a brief description of the drawings required for the description of the embodiments, and it will be obvious that the drawings in the following description are only some embodiments of the present disclosure, and that other drawings can be obtained from these drawings without creative work for those skilled in the art.

DETAILED DESCRIPTION

The present disclosure is described in further detail below in conjunction with the accompanying drawings and embodiments. In particular, it is noted that the following embodiments are intended only to illustrate the present disclosure, but do not limit the scope of the present disclosure. Likewise, the following embodiments are only some but not all embodiments of the present disclosure, and all other embodiments obtained by those skilled in the art without creative labor fall within the scope of the present disclosure.

References herein to "embodiments" mean that a particular feature, structure, or characteristic described in conjunction with an embodiment may be included in at least one embodiment of the present disclosure. The presence of the phrase at various points in the specification does not necessarily mean the same embodiment, nor is it a separate or alternative embodiment that is mutually exclusive with other embodiments. It is understood, both explicitly and implicitly, by those skilled in the art that the embodiments described herein may be combined with other embodiments.

In the description of the present disclosure, it is necessary to state that, unless otherwise expressly specified and limited, the terms "install", "set", "connect", "couple", etc. are to be understood broadly. For example, they may be fixed connection, removable connection, or integral connection; mechanical connection or electrical connection; direct connection or spaced connection through an intermediate medium. For those skilled in the art, the specific meaning of "connection" in the present disclosure can be understood on a case-by-case basis.

Figure 1:
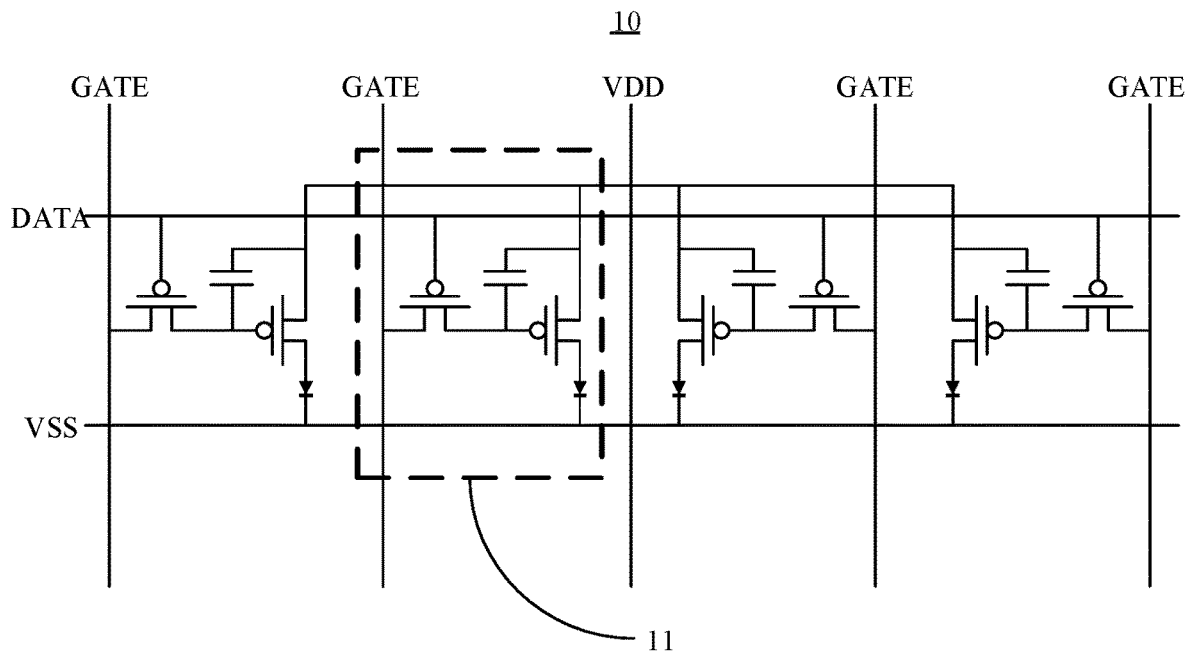
FIG. 1 is a structural schematic view of a display driving circuit according to an embodiment of the present disclosure.

The plurality of pixel circuits in the display device mentioned in the present disclosure is first described by way of example. The display driving circuit in the present disclosure may include a plurality of pixel circuits consisting of "2T1C pixel circuits". Referring to FIG. 1, FIG. 1 is a structural schematic view of a display driving circuit according to an embodiment of the present disclosure. The display driving circuit 10 includes a plurality of pixel circuits 11, and each pixel circuit 11 includes two thin-film field-effect transistors and a capacitor; a power supply end of each pixel circuit 11 is connected to a same power supply common line (VDD), and each pixel circuit 11 is connected to a negative power supply line (VSS), a data line (DATA), and a gate line (GATE). Based on the above arrangement, the display driving circuit 10 in which multiple pixel circuits 11 are connected to the same power supply common line can be constructed, which is the basic construction of the display driving circuit of the subsequent description of the present disclosure.

In addition, the pixel circuit in the display driving circuit of the present disclosure may be other types of pixel circuits other than "2T1C pixel circuit", depending on actual needs, which is not limited herein.

Figure 2:
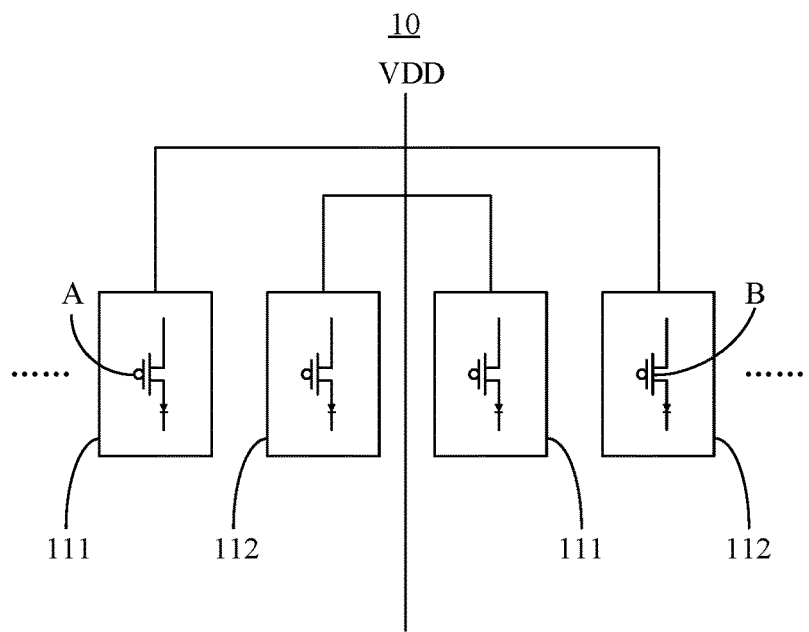
FIG. 2 is a structural schematic view of a display driving circuit according to another embodiment of the present disclosure.

The present disclosure first proposes a display driving circuit. Referring to FIG. 2, FIG. 2 is a structural schematic view of a display driving circuit according to another embodiment of the present disclosure.

As shown in FIGS. 1 and 2, the display driving circuit 10 includes a plurality of pixel circuits 11.

In the plurality of pixel circuits 11, a data end of each pixel circuit is connected to a corresponding data line (DATA), and the data end is configured to provide a data signal; a gate end of each pixel circuit is connected to a corresponding gate line (GATE), and the gate end is configured to provide a gate signal; and a ground end of each pixel circuit is connected to a corresponding negative power supply line (VSS), and the ground end is configured to provide a negative signal.

The power supply end of each pixel circuit 11 is connected to the same power supply common line (VDD), and a line connecting the power supply end of a corresponding pixel circuit to the power supply common line is noted as a power supply line of the corresponding pixel circuit.

As shown in FIG. 2, the plurality of pixel circuits 11 may be divided into at least one first pixel circuit 111 and at least one second pixel circuit 112 based on the luminous efficiency. The luminous efficiency of the first pixel circuit 111 is less than the luminous efficiency of the second pixel circuit 112, i.e., the first pixel circuit 111 displays less luminance than the second pixel circuit 112 does, with the same current supplied.

In the above premise, a width-to-length ratio of a channel of each thin-film field-effect transistor in the first pixel circuit 111 is made greater than a width-to-length ratio of a channel of each thin-film field-effect transistor in the second pixel circuit 112. In a pixel circuit, the current of the pixel circuit is related to the corresponding thin-film field-effect transistor as follows.

$$I = \frac{W}{2L} \cdot \mu \cdot C \cdot (V_{GS} - V_{th})^2 \quad (1)$$

In equation (1), I is the current of the corresponding pixel circuit, W/L is the width-to-length ratio of the channel of each thin-film field-effect transistor in the corresponding pixel circuit, μ is the mobility of each thin-film field-effect transistor in the corresponding pixel circuit, C is the constructed capacitance of each thin-film field-effect transistor in the corresponding pixel circuit, $V_{GS}$ is the voltage between the gate and the drain of each thin-film field-effect transistor in the corresponding pixel circuit, and $V_{th}$ is the minimum turn-on voltage of each thin-film field-effect transistor in the corresponding pixel circuit. The constructed capacitance is a capacitance value of a capacitance formed by a metal layer, an insulating layer, and an active layer of each thin-film field-effect transistor in the corresponding pixel circuit.

As can be seen from equation (1), the greater the width-to-length ratio of the channel of each thin-film field-effect transistor in the corresponding pixel circuit, the greater the current of the corresponding pixel circuit, with other parameters remaining unchanged. Therefore, based on the above configuration, the current of the first pixel circuit 111 may be enabled to be greater than the current of the second pixel circuit 112 while the power supply line of the first pixel circuit 111 receives the same voltage as the second pixel circuit 112 does. In this way, the difference between the luminance displayed by the first pixel circuit 111 at the corresponding current and the luminance displayed by the second pixel circuit 112 at the corresponding current is reduced. That is, by adjusting the size of the thin-film field-effect transistor to change the maximum current flowing through the pixel circuit or the current at a preset voltage, the difference in luminance between pixel circuits with different luminous efficiency may be reduced, and the uniformity of the display screen may be improved, thereby improving the display effect of the display device.

The pixel circuit 11 may be an organic light-emitting diode (OLED) pixel circuit or other types of pixel circuits, depending on actual needs, which is not limited herein.

By way of example, as shown in FIG. 2, the thin-film field-effect transistor A in the first pixel circuit 111, which has a lower luminous efficiency, has a greater width-to-length ratio of the channel than the thin-film field-effect transistor B in the second pixel circuit 112, which has a higher luminous efficiency.

In contrast to the related art, the technical solution of the present disclosure makes the width-to-length ratio of the channel of the thin-film field-effect transistor in the first pixel circuit with lower luminous efficiency greater than the width-to-length ratio of the channel of the thin-film field-effect transistor in the second pixel circuit with higher luminous efficiency, in the plurality of pixel circuits sharing the same power supply common line, such that the current corresponding to the first pixel circuit is greater than the current corresponding to the second pixel circuit at the same voltage, which reduces the difference in luminance between the light emitted from the first pixel circuit and the light emitted from the second pixel circuit, and improves the uniformity of the display screen of the display device, thereby improving the display effect of the display device.

In some embodiments, a ratio between the width-to-length ratio of the channel of each thin-film field-effect transistor in a driving module of the first pixel circuit 111 and the width-to-length ratio of the channel of each thin-film field-effect transistor in a driving module of the second pixel circuit 112 is denoted as a first ratio, and a ratio between the current when the first pixel circuit 111 emits light of a predetermined luminance and the current when the second pixel circuit 112 emits light of the same predetermined luminance is denoted as a second ratio. The first ratio and the second ratio are positively correlated.

Specifically, the ratio of the current corresponding to the first pixel circuit 111 to the current corresponding to the second pixel circuit 112 when the first pixel circuit 111 and the second pixel circuit 112 emit the same luminance may be noted as the second ratio, and the first ratio is positively correlated with the second ratio.

The first ratio may be within a threshold range corresponding to the second ratio, and the value of the second ratio lies within the threshold range corresponding to the second ratio. The value of the second ratio may be one of a maximum value, a minimum value, a median value, and any other value of the threshold range corresponding to the second ratio, without limitation herein. The threshold range corresponding to the second ratio is associated with a characteristic of the corresponding pixel circuit, which may include a characteristic of each thin-film field-effect transistor in the pixel circuit.

In some embodiments, the first ratio is equal to the second ratio.

Specifically, the first ratio may be made equal to the second ratio, i.e., the ratio between the width-length ratio of the channel of the thin-film field-effect transistor in the first pixel circuit 111 and the width-length ratio of the channel of the thin-film field-effect transistor in the second pixel circuit 112 is the same as the ratio between the current when the first pixel circuit 111 emits light of a predetermined luminance and the current when the second pixel circuit 112 emits light of the same predetermined luminance, such that when both the first pixel circuit 111 and the second pixel circuit 112 are connected to the same power supply common line to receive the same power supply voltage, the luminance of the light emitted by the first pixel circuit 111 and the luminance of the light emitted by the second pixel circuit 112 are the same. In this way, it may be ensured that the luminance of each pixel circuit 11 in different display driving circuits 10 remains the same, thereby improving the uniformity of the display screen and improving the display effect of the display device.

In some embodiments, the power supply line is a connection line between the power supply end of the corresponding pixel unit and the power supply common line.

Figure 3:
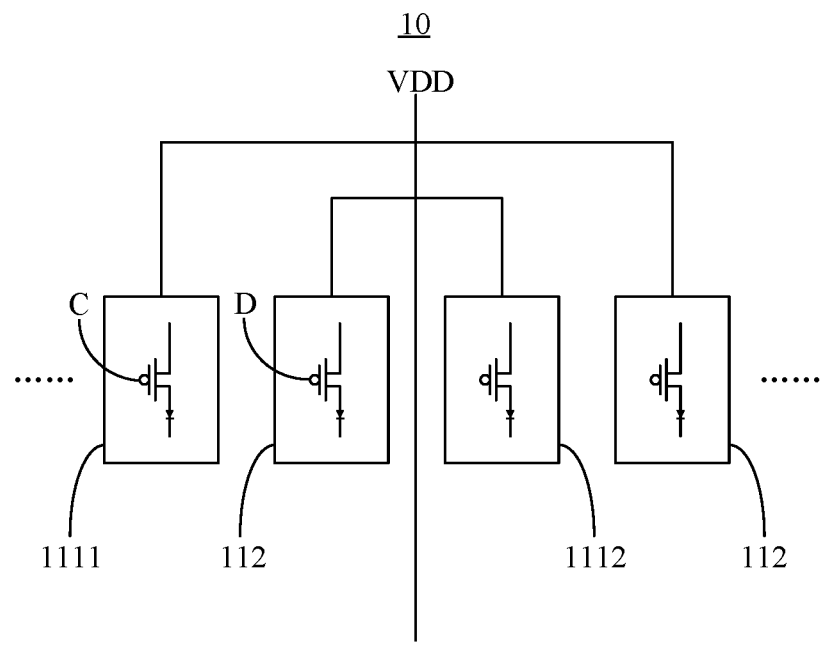
FIG. 3 is a structural schematic view of a display driving circuit according to further another embodiment of the present disclosure.

As shown in FIG. 3, the plurality of pixel circuits 11 include at least two first pixel circuits 111, and each of the at least two first pixel circuits 111 has the same luminous efficiency. The at least two first pixel circuits 111 may be divided into at least one first-class pixel circuit 1111 and at least one second-class pixel circuit 1112. The length of the power supply line of the first-class pixel circuit 1111 is greater than the length of the power supply line of the second-class pixel circuit 1112.

It should be noted that the current-voltage resistance equation and the resistance equation are as follows.

$$I = \frac{U}{R} \quad (2)$$

$$R = \rho \frac{L}{S} \quad (3)$$

In equations (2) and (3), I is the current of the corresponding pixel circuit, U is the voltage of the corresponding pixel circuit, R is the resistance of the power supply line of the corresponding pixel circuit, $\rho$ is the resistivity of the power supply line of the corresponding pixel circuit, L is the length of the power supply line of the corresponding pixel circuit, and S is the cross-sectional area of the power supply line of the corresponding pixel circuit.

From equation (2), it can be seen that the current is inversely proportional to the resistance, and from equation (3), it can be seen that the resistance is proportional to the length of the power supply line. Therefore, in cases where other parameters are the same, the greater the length of the power supply line, the greater the corresponding resistance, and the less the corresponding current.

Therefore, according to the above resistance formula equation (3), in cases where parameters in equation (3) other than length are the same, the resistance corresponding to the power supply line of the first-class pixel circuit 1111 with a longer length is greater, such that the width-to-length ratio of the channel of the thin-film field-effect transistor in the driving module of the first-class pixel circuit 1111 is greater than the width-to-length ratio of the channel of the thin-film field-effect transistor in the driving module of the second-class pixel circuit 1112. In this way, the current of the first-class pixel circuit 1111 and the current of the second-class pixel circuit 1112 receiving the supply voltage from the same power supply common line tends to be equal. Since the luminous efficiency of the first-class pixel circuit 1111 and the luminous efficiency of the second-class pixel circuit 1112 are the same, the consistency of the luminance emitted by the first-class pixel circuit 1111 and the second-class pixel circuit 1112 in the at least two first pixel circuits 111 may be improved based on the above approach, thereby improving the display effect of the display device.

By way of example, as shown in FIG. 3, the width-to-length ratio of the channel of the thin-film field-effect transistor C in the driving module of the first-class pixel circuit 1111, which has a longer length of the power supply line, is greater than the width-to-length ratio of the channel of the thin-film field-effect transistor D in the driving module of the second-class pixel circuit 1112, which has a shorter length of the power supply line.

In some embodiments, the ratio between the length of the power supply line of the first-class pixel circuit 1111 and the length of the power supply line of the second-class pixel circuit 1112 may be noted as a third ratio, and the ratio between the width-to-length ratio of the channel of the thin-film field-effect transistor in the driving module of the first-class pixel circuit 1111 and the width-to-length ratio of the channel of the thin-film field-effect transistor in the driving module of the second-class pixel circuit 1112 may be noted as a fourth ratio. The third ratio is positively correlated with the fourth ratio.

The fourth ratio may be within a threshold range corresponding to the third ratio, and the value of the third ratio lies within the threshold range corresponding to the third ratio. The value of the third ratio may be one of a maximum value, a minimum value, a median value, and any other value of the threshold range corresponding to the third ratio, without limitation herein. The threshold range corresponding to the third ratio is associated with a characteristic of the corresponding pixel circuit, which may include a characteristic of the thin-film field-effect transistor in the pixel circuit.

As an example, as shown in FIG. 3, assuming that the distance between a pixel circuit closest to the first common line VDD (such as the second pixel circuit 112 and the second-class pixel circuit 1112) and the first common line VDD is L0, and the distance between each adjacent pixel circuits is Lp, the length of the power supply line of the first-class pixel circuit 1111 is (Lp+L0), the length of the power supply line of the second-class pixel circuit 1112 is L0, and the third ratio is (Lp+L0):L0. In this case, the ratio between the width-to-length ratio of the channel of the thin-film field-effect transistor in the driving module of the power supply line of the first-class pixel circuit 1111 and the width-to-length ratio of the channel of the thin-film field-effect transistor in the driving module of the power supply line of the second-class pixel circuit 1112, i.e., the fourth ratio, is also (Lp+L0):L0, such that the resistance of the power supply line of the first-class pixel circuit 1111 and the resistance of the power supply line of the second-class pixel circuit 1112 shown in FIG. 3 tends to be equal, thereby improving the luminance uniformity between the first-class pixel circuit 1111 and the second-class pixel circuit 1112 and improving the display effect of the display device.

It should be noted that the above is only an example of the structure of a display driving circuit, and the length of the power supply line, the third ratio, and the fourth ratio may change accordingly when the distance of the first-class pixel circuit 1111 from the first common line VDD and the distance of the second-class pixel circuit 1112 from the first common line VDD are different from the above example, which is not limited herein.

In addition, as shown in FIG. 3, the width-to-length ratio of the channel of the thin-film field-effect transistor in the driving module of the power supply line of the first-class of pixel circuit 1111 is the greatest, the width-to-length ratio of the channel of the thin-film field-effect transistor in the driving module of the power supply line of the second-class of pixel circuit 1112 is medium, and the width-to-length ratio of the channel of the thin-film field-effect transistor in the driving module of the power supply line of the second pixel circuit 112 is the least.

Specifically, the third ratio is equal to the fourth ratio.

That is, assuming that the length of the power supply line of the first-class pixel circuit 1111 is a first length and the length of the power supply line of the second-class pixel circuit 1112 is a second length, and the quotient of the second length divided by the first length is a target multiple, the width-to-length ratio of the channel of the thin-film field-effect transistor in the driving module of the second-class pixel circuit 1112 is the target multiple of the width-to-length ratio of the channel of the thin-film field-effect transistor in the driving module of the first-class pixel circuit 1111.

Based on the above approach, the resistance corresponding to the power supply line of the first-class pixel circuit 1111 and the resistance corresponding to the power supply line of the second-class pixel circuit 1112 tend to be equal, such that the current of the first-class pixel circuit 1111 and the current of the second-class pixel circuit 1112 receiving the power supply voltage from the same power supply common line is equal. Since the luminous efficiency of the first-class pixel circuit 1111 and the luminous efficiency of the second-class pixel circuit 1112 are the same, the luminance emitted by the first-class pixel circuit 1111 and the second-class pixel circuit 1112 in the at least two first pixel circuits 111 may be improved based on the above approach, thereby improving the display effect of the display device.

In some embodiments, the first pixel circuit 111 is a blue pixel circuit and the second pixel circuit 112 is a red pixel circuit or a green pixel circuit.

Specifically, in practice, the luminous efficiency of a blue pixel circuit is usually lower than that of a red pixel circuit or a green pixel circuit, where the luminous efficiency of the red pixel circuit is similar to that of the green pixel circuit. The luminous efficiency of the pixel circuit 11 is usually associated with the material of the light-emitting semiconductor in the pixel circuit 11, which may be a light-emitting diode.

Figure 4:
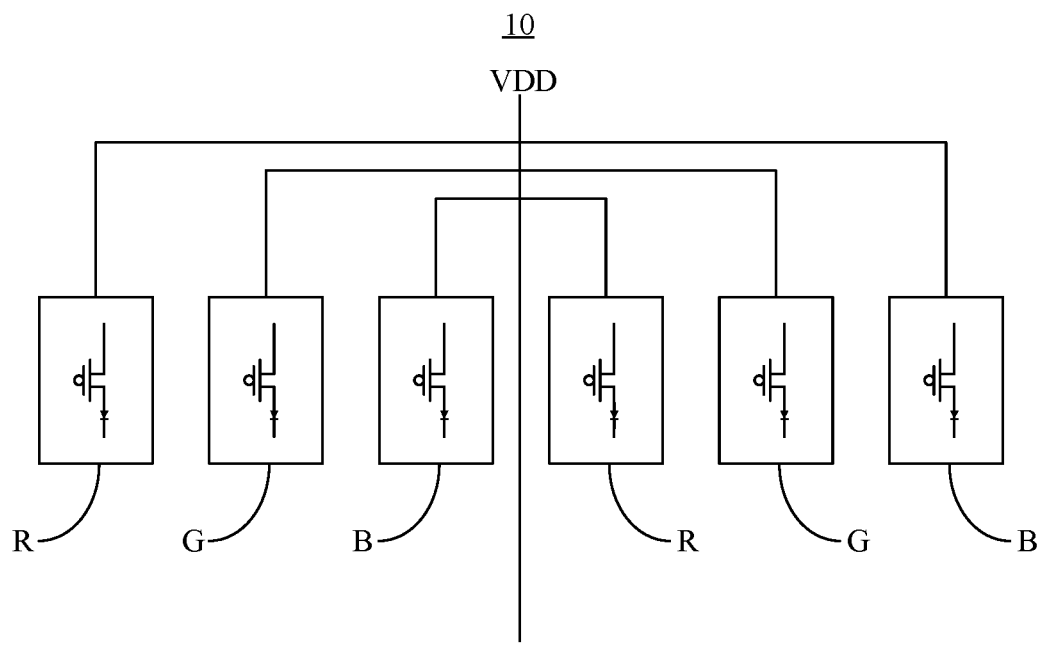
FIG. 4 is a structural schematic view of a display driving circuit according to further another embodiment of the present disclosure.

By way of example, as shown in FIG. 4, the plurality of pixel circuits 11 include a red pixel circuit R, a green pixel circuit G, and a blue pixel circuit B.

It should be noted that, in general, the luminous efficiency of the red pixel circuit R and the luminous efficiency of the green pixel circuit G are similar in values, and in this example, it is assumed that the luminous efficiency of the red pixel circuit R and the luminous efficiency of the green pixel circuit G are equal, while the luminous efficiency of the blue pixel circuit B is less than the luminous efficiency of the red pixel circuit R or the green pixel circuit G. In this premise, the blue pixel circuit B may be taken as the first pixel circuit 111 with lower luminous efficiency, and the red pixel circuit R and the green pixel circuit G as the second pixel circuit 112 with higher luminous efficiency.

As shown in FIG. 4, the width-to-length ratio of the channel of the thin-film field-effect transistor in the driving module of the power supply line of the blue pixel circuit B is greater than the width-to-length ratio of the channel of the thin-film field-effect transistor in the driving module of the power supply line of the red pixel circuit R or the green pixel circuit G. When the ratio between the width-to-length ratio of the channel of the thin-film field-effect transistor in the driving module of the power supply line of the blue pixel circuit B and the width-to-length ratio of the channel of the thin-film field-effect transistor in the driving module of the power supply line of the red pixel circuit R or the green pixel circuit G as a first ratio, and when the ratio between the luminous efficiency of the blue pixel circuit B and the luminous efficiency of the red pixel circuit R or the green pixel circuit G is taken as a second ratio, the first ratio and the second ratio may be positively correlated, and even the first ratio may be equal to the second ratio. In this way, the resistance of the power supply line of the blue pixel circuit B is equal to the resistance of the power supply line of the red pixel circuit R or the green pixel circuit G, thereby enabling the red pixel circuit R, the green pixel circuit G, and the blue pixel circuit B to emit light of the same luminance after receiving the power supply voltage provided by the same first common line, thereby improving the luminance uniformity of each pixel circuit, and thereby improving the display effect of the display device.

Figure 5:
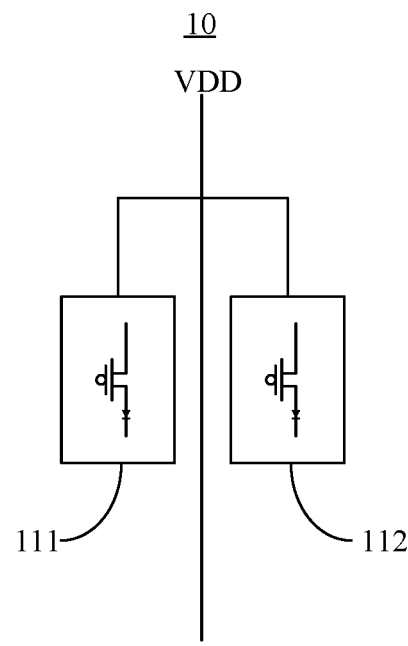
FIG. 5 is a structural schematic view of a display driving circuit according to further another embodiment of the present disclosure.

As shown in FIG. 5, the first pixel circuit 111 is a blue pixel circuit and the second pixel circuit 112 is a red pixel circuit. The luminous efficiency of the blue pixel circuit is less than the luminous efficiency of the red pixel circuit, and the width-to-length ratio of the thin-film field-effect transistor in the blue pixel circuit is greater than the width-to-length ratio of the thin-film field-effect transistor in the red pixel circuit.

Figure 6:
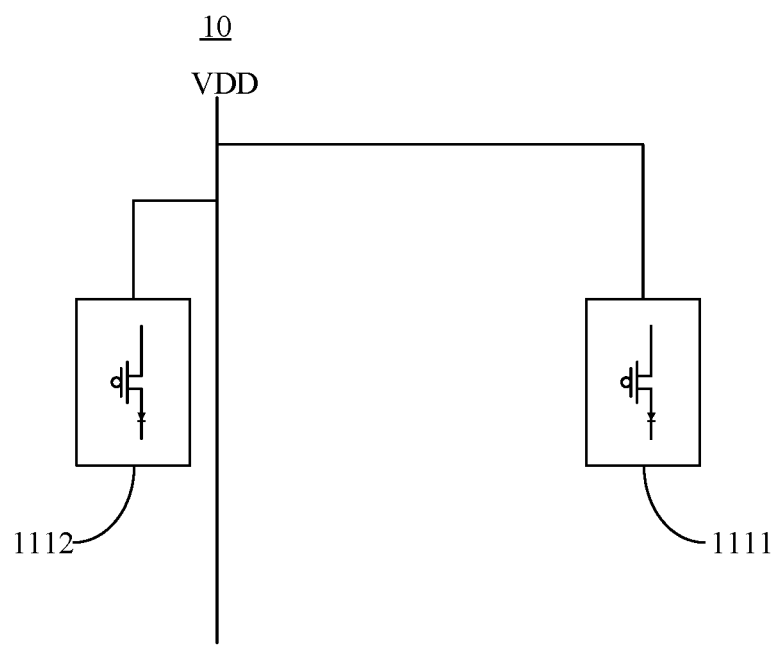
FIG. 6 is a structural schematic view of a display driving circuit according to further another embodiment of the present disclosure.

As shown in FIG. 6, the first-class pixel circuit 1111 is a blue pixel circuit with a longer power supply line, and the second-class pixel circuit 1112 is a blue pixel circuit with a shorter power supply line, both of which have equal luminous efficiency, and the width-to-length ratio of the channel of the thin-film field-effect transistor in the driving module of the blue pixel circuit with the longer power supply line is greater than the width-to-length ratio of the channel of the thin-film field-effect transistor in the driving module of the blue pixel circuit with a shorter power supply line.

Figure 7:
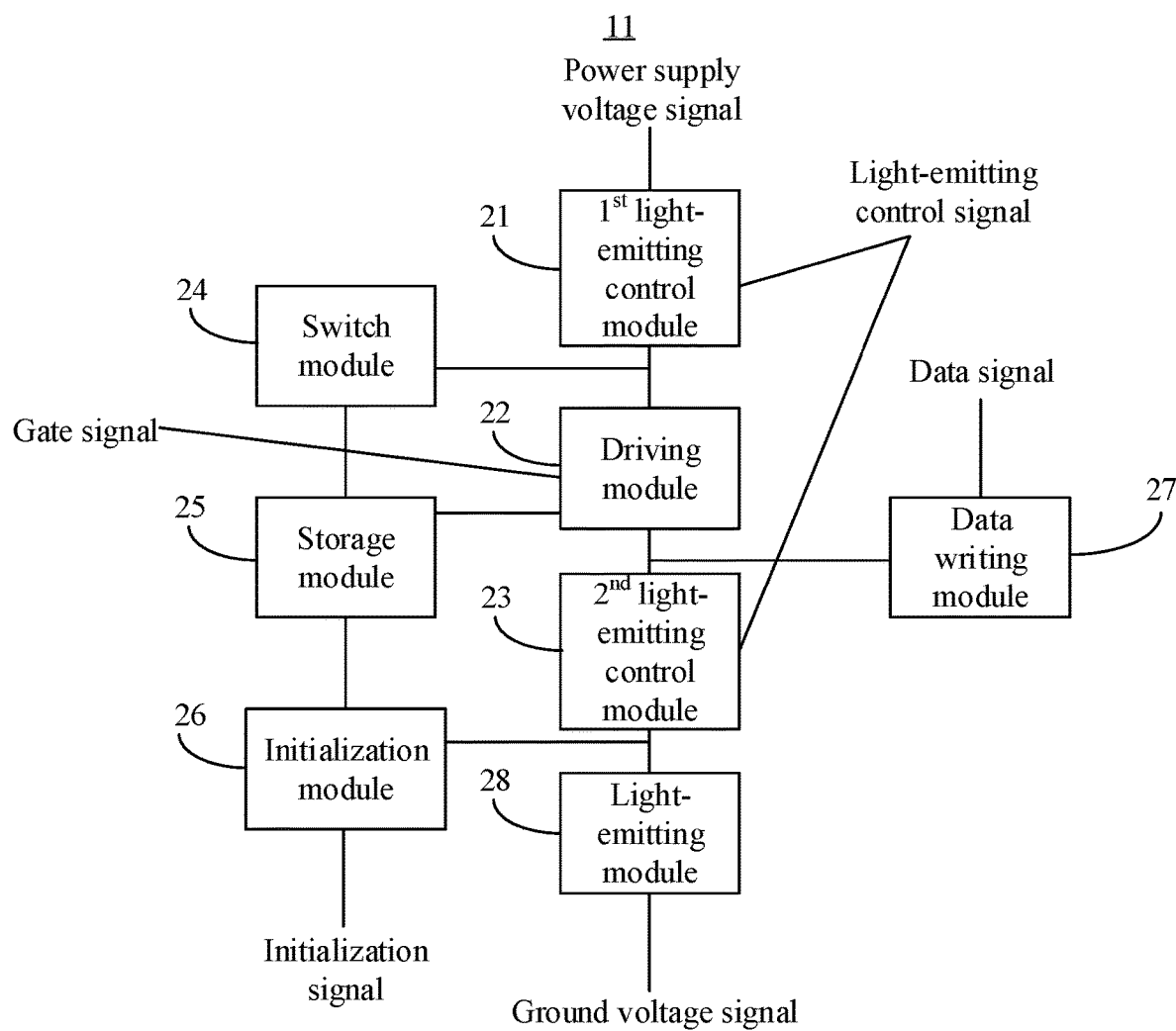
FIG. 7 is a structural schematic view of a pixel circuit according to an embodiment of the present disclosure.

In some embodiments, as shown in FIG. 7, FIG. 7 is a structural schematic view of a pixel circuit according to an embodiment of the present disclosure. The pixel circuit 11 includes a first light-emitting control module 21, a driving module 22, a second light-emitting control module 23, a switch module 24, a storage module 25, an initialization module 26, a data writing module 27, and a light-emitting module 28.

An input end of the data writing module 27 is configured to receive a data signal, an output end of the data writing module 27 is connected to an input end of the second light-emitting control module 23, an input end of the first light-emitting control module 21 is configured to receive a power supply voltage signal, an output end of the first light-emitting control module 21 is connected to an input end of the driving module 22, a gate of the driving module 22 is configured to receive a gate signal, an output end of the driving module 22 is connected to the input end of the second light-emitting control module 23, the driving module 22 includes the above-mentioned thin-film field-effect transistor, an output end of the second light-emitting control module 23 is connected to an input end of the light-emitting module 28, an output end of the light-emitting module 28 is configured to receive a ground voltage signal, an input end of the initialization module 26 is configured to receive an initialization signal, a first output end of the initialization module 26 is connected to an input end of the memory module 25, a second output end of the initialization module 26 is connected to the input end of the light-emitting module 28, a first output end of the storage module 25 is connected to an input end of the switch module 24, a second output end of the storage module 25 is connected to a drive end of the drive module 22, and an output end of the switch module 24 is connected to an input end of the drive module 22.

(a) In some embodiments, the number of the plurality of pixel circuits 11 is greater than 2 and not greater than a common number, the common number being a value determined based on a formula for calculating the same.

The formula for calculating the shared quantity is as follows.

$$\begin{cases} n_1 = \left(\dfrac{H_1}{k \times (I \times R_1)^2}\right)^{\frac{1}{4}} \\ k = \mu \times \dfrac{W}{L} \times C \end{cases}$$

Where $n_1$ is the common number, $H_1$ is a preset constant, k is a characteristic parameter of the thin-film field-effect transistor of the pixel circuit, $R_1$ is the resistance of the power supply lines between adjacent pixel circuits in the multiple pixel circuits, μ is the mobility of the thin-film field-effect transistor, W is the width of the channel of the thin-film field-effect transistor, L is the length of the channel of the thin-film field-effect transistor, and C is the construction capacitance of the thin-film field-effect transistor.

Specifically, in an example, the preset constant is positively correlated with the current in the pixel circuit 11 and negatively correlated with the current fluctuation value between adjacent pixel circuits. Specifically, the current fluctuation value between adjacent pixel circuits is a current difference value between adjacent pixel circuits 11. To ensure uniformity of the luminance displayed by each pixel circuit in the display device, the current difference is usually limited to 2%-3% of the current in the pixel circuit 11.

In another example, the preset constant may be specifically within a preset constant range that may be determined based on actual operating hardware conditions and/or operating environment conditions of the display device. For example, the preset constant range may be 0.08-0.12 or in other ranges, which is not limited herein.

In practice, the power supply lines of adjacent pixel circuits 11 connecting the same power supply common line are each connected to the same node. Through the connection of this node to the power supply common line, the adjacent pixel circuits 11 are connected to the same power supply common line. Therefore, by using the resistance of the power supply lines between adjacent pixel circuits as one of the parameters in the above-mentioned common number calculation formula, the relevant parameters of the display driving circuit may be more comprehensively considered, thereby obtaining the most suitable common number to improve the display effect of the display device.

Based on the above, a maximum number of pixel circuits 11 that share the same power supply common line (i.e., the above common number) may be determined based on data related to each pixel circuit 11 in the display driving circuit, and the number of the plurality of pixel circuits 11 does not exceed the maximum number, such that the total resistance of the connection line between each of the plurality of pixel circuits 11 and the power supply common line is not significantly different. This improves the uniformity of the amplitude of the power supply voltage signal received by each of the plurality of pixel circuits 11, thereby improving the display effect of the display device including the display driving circuit.

In turn, a more reasonable common number may be calculated and obtained by using the formula for calculating the common number, thereby limiting the number of the plurality of pixel circuits 11 and improving the display effect of the display device.

Figure 8:
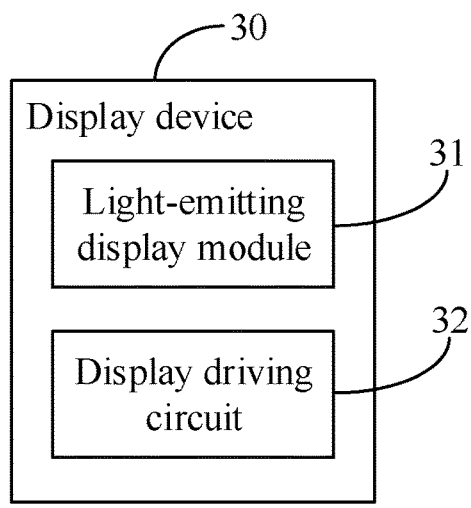
FIG. 8 is a structural schematic view of a display device according to an embodiment of the present disclosure.

The present disclosure further discloses a display device. Referring to FIG. 8, FIG. 8 is a structural schematic view of a display device according to an embodiment of the present disclosure. The display device 30 includes a light-emitting display module 31 and a display driving circuit 32, and the display driving circuit 32 may be any display driving circuit 10 in the previous embodiments, and will not be repeated here.

The display device may be an in-vehicle display device, or a television, or a mobile terminal display, or other types of display devices, without limitation herein.

In contrast to the related art, the technical solution of the present disclosure makes the width-to-length ratio of the channel of the thin-film field-effect transistor in the first pixel circuit with lower luminous efficiency greater than the width-to-length ratio of the channel of the thin-film field-effect transistor in the second pixel circuit with higher luminous efficiency, in the plurality of pixel circuits sharing the same power supply common line, such that the current corresponding to the first pixel circuit is greater than the current corresponding to the second pixel circuit at the same voltage, which reduces the difference in luminance between the light emitted from the first pixel circuit and the light emitted from the second pixel circuit, and improves the uniformity of the display screen of the display device, thereby improving the display effect of the display device.

In the description of the present disclosure, reference to the terms "an embodiment," "some embodiments," "example," "specific example," or "some examples" means that the specific features, structures, materials, or characteristics described in connection with the embodiment or example are included in at least one embodiment or example of the present disclosure. In this specification, the schematic representation of the above terms does not have to be directed to the same embodiment or example. Moreover, the specific features, structures, materials, or characteristics described may be combined in a suitable manner in any one or more embodiments or examples. In addition, without contradicting each other, those skilled in the art may combine different embodiments or examples described in this specification and the features of the different embodiments or examples.

In addition, the terms "first" and "second" are used for descriptive purposes only and are not to be construed as indicating or implying relative importance or implicitly specifying the number of technical features indicated. Therefore, the features defined with "first" and "second" may explicitly or implicitly include at least one such feature. In the description of the present disclosure, "plurality" means at least two, such as two, three, etc., unless otherwise expressly and specifically limited.

Any process or method description in the flowchart or otherwise described herein may be understood to represent a module, fragment, or portion of code including one or more executable instructions for implementing steps of a particular logical function or process, and the scope of preferred embodiments of the present disclosure includes additional implementations in which the functions may be performed not in the order shown or discussed, including in a substantially simultaneous manner according to the functions involved or in the reverse order, as should be understood by those skilled in the art.

The logic and/or steps represented in the flowchart or otherwise described herein, for example, may be considered to be a sequential list of executable instructions for implementing a logical function that may be specifically implemented in any computer-readable medium for use by or in conjunction with an instruction execution system, device or apparatus (which may be a personal computer, server, network device or other system that can take instructions from and execute instructions from an instruction execution system, device or apparatus). For purposes of this specification, a "computer-readable medium" may be any device that can contain, store, communicate, transmit, or transfer a program for use by or in conjunction with an instruction execution system, device, or apparatus. More specific examples (a non-exhaustive list) of computer-readable medium include: electrically connected sections (electronic devices) having one or more wiring, portable computer disk cartridges (magnetic devices), random access memory (RAM), read-only memory (ROM), erasable editable read-only memory (EPROM or flash memory), fiber optic devices, and portable compact disc read-only memory (CDROM). In addition, the computer-readable medium may even be paper or other suitable medium on which the program may be printed, since the program may be obtained electronically, for example, by optical scanning of the paper or other medium, followed by editing, decoding or, if necessary, processing in other suitable ways, and then storing the program in the computer memory.

The above is only an implementation of the present disclosure, and is not intended to limit the scope of the present disclosure. Any equivalent structure or equivalent process transformation using the contents of the specification and the accompanying drawings, or any direct or indirect application in other related technical fields, is included in the scope of the present disclosure.

What is claimed is:

1. A display driving circuit, comprising a plurality of pixel circuits;

wherein a data end of each pixel circuit is connected to a corresponding data line, and the data end is configured to provide a data signal; a gate end of each pixel circuit is connected to a corresponding gate line, and the gate end is configured to provide a gate signal; and a power supply end of each pixel circuit is connected to a same power supply common line;

the plurality of pixel circuits are divided into at least one first pixel circuit and at least one second pixel circuit, and a luminous efficiency of each of the at least one first pixel circuit is less than a luminous efficiency of each of the at least one second pixel circuit; a width-to-length ratio of a channel of a thin-film field-effect transistor in a driving module of each of the at least one first pixel circuit is greater than a width-to-length ratio of a channel of a thin-film field-effect transistor in a driving module of each of the at least one second pixel circuit, wherein a power supply line is a connection line between the power supply end of a corresponding pixel unit and the power supply common line; the number of the at least one first pixel circuit is at least two, and the at least one first pixel circuit have a same luminous efficiency; the at least one first pixel circuit are divided into at least one first-class pixel circuit and at least one second-class pixel circuit; each of the at least one first-class pixel circuit is a blue pixel circuit, each of the at least one second-class pixel circuit is a blue pixel circuit, a length of the power supply line of each of the at least one first-class pixel circuit is greater than a length of the power supply line of each of the at least one second-class pixel circuit; the width-to-length ratio of the channel of the thin-film field-effect transistor in the driving module of each of the at least one first-class pixel circuit is greater than the width-to-length ratio of the channel of the thin-film field-effect transistor in the driving module of each of the at least one second-class pixel circuit, wherein a ratio between the length of the power supply line of each of the at least one first-class pixel circuit and the length of the power supply line of each of the at least one second-class pixel circuit is a third ratio, and a ratio between the width-to-length ratio of the channel of the thin-film field-effect transistor in the driving module of each of the at least one first-class pixel circuit and the width-to-length ratio of the channel of the thin-film field-effect transistor in the driving module of each of the at least one second-class pixel circuit is a fourth ratio; the third ratio is positively correlated with the fourth ratio, the third ratio is equal to the fourth ratio, wherein each of the at least one first pixel circuit is a blue pixel circuit.

2. The display driving circuit according to claim 1, wherein a ratio between the width-to-length ratio of the channel of the thin-film field-effect transistor in the driving module of each of the at least one first pixel circuit and the width-to-length ratio of the channel of the thin-film field-effect transistor in the driving module of each of the at least one second pixel circuit is a first ratio, and a ratio between a current when each of the at least one first pixel circuit emits light of a predetermined luminance and a current when each of the at least one second pixel circuit emits light of the predetermined luminance is a second ratio; the first ratio is positively correlated with the second ratio.

3. The display driving circuit according to claim 2, wherein the first ratio is equal to the second ratio.

4. The display driving circuit according to claim 2, wherein the first ratio lies within a threshold range corresponding to the second ratio, and the second ratio lies within the threshold range.

5. The display driving circuit according to claim 1, wherein the fourth ratio lies within a threshold range corresponding to the third ratio, and the third ratio lies within the threshold range.

6. The display driving circuit according to claim 1, wherein each of the at least one second pixel circuit is a red pixel circuit or a green pixel circuit.

7. The display driving circuit according to claim 6, wherein the luminous efficiency of each pixel circuit is associated with a material of a light-emitting semiconductor in the each pixel circuit.

8. A display device, comprising a light-emitting display module and a display driving circuit;
wherein the display driving circuit comprises a plurality of pixel circuits;
a data end of each pixel circuit is connected to a corresponding data line, and the data end is configured to provide a data signal; a gate end of each pixel circuit is connected to a corresponding gate line, and the gate end is configured to provide a gate signal; and a power supply end of each pixel circuit is connected to a same power supply common line;
the plurality of pixel circuits are divided into at least one first pixel circuit and at least one second pixel circuit, and a luminous efficiency of each of the at least one first pixel circuit is less than a luminous efficiency of each of the at least one second pixel circuit; a width-to-length ratio of a channel of a thin-film field-effect transistor in a driving module of each of the at least one first pixel circuit is greater than a width-to-length ratio of a channel of a thin-film field-effect transistor in a driving module of each of the at least one second pixel circuit, wherein a power supply line is a connection line between the power supply end of a corresponding pixel unit and the power supply common line; the number of the at least one first pixel circuit is at least two, and the at least one first pixel circuit have a same luminous efficiency; the at least one first pixel circuit are divided into at least one first-class pixel circuit and at least one second-class pixel circuit; each of the at least one first-class pixel circuit is a blue pixel circuit, each of the at least one second-class pixel circuit is a blue pixel circuit, a length of the power supply line of each of the at least one first-class pixel circuit is greater than a length of the power supply line of each of the at least one second-class pixel circuit; the width-to-length ratio of the channel of the thin-film field-effect transistor in the driving module of each of the at least one first-class pixel circuit is greater than the width-to-length ratio of the channel of the thin-film field-effect transistor in the driving module of each of the at least one second-class pixel circuit, wherein a ratio between the length of the power supply line of each of the at least one first-class pixel circuit and the length of the power supply line of each of the at least one second-class pixel circuit is a third ratio, and a ratio between the width-to-length ratio of the channel of the thin-film field-effect transistor in the driving module of each of the at least one first-class pixel circuit and the width-to-length ratio of the channel of the thin-film field-effect transistor in the driving module of each of the at least one second-class pixel circuit is a fourth ratio; the third ratio is positively correlated with the fourth ratio, the third ratio is equal to the fourth ratio, wherein each of the at least one first pixel circuit is a blue pixel circuit.

9. The display device according to claim 8, wherein a ratio between the width-to-length ratio of the channel of the thin-film field-effect transistor in the driving module of each of the at least one first pixel circuit and the width-to-length ratio of the channel of the thin-film field-effect transistor in the driving module of each of the at least one second pixel circuit is a first ratio, and a ratio between a current when each of the at least one first pixel circuit emits light of a predetermined luminance and a current when each of the at least one second pixel circuit emits light of the predetermined luminance is a second ratio; the first ratio is positively correlated with the second ratio.

10. The display device according to claim 8, wherein each of the at least one second pixel circuit is a red pixel circuit or a green pixel circuit.

* * * * *